(12) United States Patent
McLaughlin et al.

(10) Patent No.: US 10,535,499 B2
(45) Date of Patent: Jan. 14, 2020

(54) VARIED COMPONENT DENSITY FOR THERMAL ISOLATION

(71) Applicant: Varian Semiconductor Equipment Associates, Inc., Gloucester, MA (US)

(72) Inventors: Adam M. McLaughlin, Merrimac, MA (US); Craig R. Chaney, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 75 days.

(21) Appl. No.: 15/803,334

(22) Filed: Nov. 3, 2017

(65) Prior Publication Data

US 2019/0139742 A1    May 9, 2019

(51) Int. Cl.
| | |
|---|---|
| *H01J 37/00* | (2006.01) |
| *H01J 37/317* | (2006.01) |
| *G05B 13/02* | (2006.01) |
| *H01L 21/425* | (2006.01) |
| *H01J 37/075* | (2006.01) |
| *H01L 21/265* | (2006.01) |
| *H01J 27/20* | (2006.01) |

(52) U.S. Cl.
CPC ........ *H01J 37/3172* (2013.01); *G05B 13/021* (2013.01); *H01J 27/205* (2013.01); *H01J 37/075* (2013.01); *H01L 21/265* (2013.01); *H01L 21/425* (2013.01)

(58) Field of Classification Search
CPC .... H01J 37/3172; H01J 27/205; H01J 37/075; H01L 21/265; H01L 21/425; G05B 13/021

USPC ...... 250/423 R, 424, 492.1, 492.21
See application file for complete search history.

(56) References Cited

U.S. PATENT DOCUMENTS

| 7,564,042 | B2 | 7/2009 | Lee et al. | |
|---|---|---|---|---|
| 9,691,584 | B1 * | 6/2017 | Tieger | ...... H01J 37/08 |
| 9,870,893 | B2 * | 1/2018 | Colvin | ...... H01J 37/045 |
| 2006/0272775 | A1 * | 12/2006 | Horsky | ...... C23C 14/48 |
| | | | | 156/345.37 |
| 2009/0236547 | A1 * | 9/2009 | Huang | ...... H01J 37/20 |
| | | | | 250/492.21 |

(Continued)

FOREIGN PATENT DOCUMENTS

| EP | 0934600 A1 | 8/1999 |
|---|---|---|
| WO | 98/18150 A1 | 4/1998 |

OTHER PUBLICATIONS

International Search Report and Written Opinion dated Feb. 1, 2019 in corresponding PCT application No. PCT/US2018/054945.

*Primary Examiner* — Michael Maskell
(74) *Attorney, Agent, or Firm* — Nields, Lemack & Frame, LLC (57) ABSTRACT

A system that utilizes a component that controls thermal gradients and the flow of thermal energy by variation in density is disclosed. Methods of fabricating the component are also disclosed. The component is manufactured using additive manufacturing. In this way, the density of different regions of the component can be customized as desired. For example, a lattice pattern may be created in the interior of a region of the component to reduce the amount of material used. This reduces weight and also decreases the thermal conduction of that region. By using low density regions and high density regions, the flow of thermal energy can be controlled to accommodate the design constraints.

20 Claims, 8 Drawing Sheets

(56) References Cited

U.S. PATENT DOCUMENTS

| | | | |
|---|---|---|---|
| 2016/0111250 A1* | 4/2016 | Sato ........................ | H01J 37/08 |
| | | | 313/153 |
| 2016/0189935 A1* | 6/2016 | Biloiu ............... | H01J 37/32357 |
| | | | 250/423 R |
| 2016/0319678 A1 | 11/2016 | Staroselsky et al. | |
| 2017/0207057 A1* | 7/2017 | Colvin .................. | H01J 37/045 |

* cited by examiner

VARIED COMPONENT DENSITY FOR THERMAL ISOLATION

FIELD

Embodiments of the present disclosure relate to systems wherein the density of a component is varied for purposes of thermal management.

BACKGROUND

The fabrication of a semiconductor device involves a plurality of discrete and complex processes. These processes may be performed using a workpiece processing system. This workpiece processing system may be a beam-line ion implantation system or a plasma processing chamber, for example. In certain embodiments, the temperatures of the components in the workpiece processing system are highly relevant to the process being performed.

For example, a feed gas may be ionized in an ion source and extracted through an extraction aperture disposed on an extraction plate. This extraction plate may be made of metal. If the temperature of the extraction plate in the vicinity of the extraction aperture is sufficiently low, feed gas may condense on the extraction plate proximate the extraction aperture. This condensed feed gas becomes a deposition on the extraction plate. If the deposition occurs along the walls forming the extraction aperture, the extracted ion beam may become partially blocked, resulting in a nonuniform process.

While deposition around the extraction aperture due to condensation is described as an issue, other components in the workpiece processing system may have similar temperature sensitivities. For example, in certain embodiments, it may be beneficial to keep a component, or a particular portion of a component above a certain temperature. Conversely, it may be advantageous to keep a second component or a portion of that component below a certain temperature.

One approach to thermal management is through the variation of the amount of material in different portions of a component. For a given material, thicker regions will have better thermal conductivity than thinner regions. However, varying the thickness of a component may affect its strength and brittleness.

Therefore, it would be beneficial if there were a system that employed a component that achieved the desired thermal gradient and flow pattern without compromising its strength or durability. It would also be advantageous if the component was easy to manufacture.

SUMMARY

A system that utilizes a component that controls thermal gradients and the flow of thermal energy by variation in density is disclosed. Methods of fabricating the component are also disclosed. The component is manufactured using additive manufacturing. In this way, the density of different regions of the component can be customized as desired. For example, a lattice pattern may be created in the interior portion of a region of the component to reduce the amount of material used. This lattice pattern reduces weight and also decreases the thermal conduction of that region. By using low density regions and high density regions, the flow of thermal energy can be controlled to accommodate the design constraints.

According to one embodiment, an ion implantation system is disclosed. The ion implantation system comprises at least one component that includes a high density region and a low density region configured to control a thermal gradient and flow of thermal energy. In certain embodiments, the component is an extraction plate. In some embodiments, the interior portion of the low density region comprises a lattice pattern. In some embodiments, the interior portion of the low density region comprises voids created by varying at least one operating parameter used to create the component.

According to a second embodiment, an apparatus is disclosed. The apparatus comprises a plurality of walls defining a chamber; an ion source to create ions within the chamber; and an extraction plate, disposed on one end of the chamber, having an extraction aperture, wherein the extraction plate comprises a low density region and a high density region. In certain embodiment, the ion source comprises an indirectly heated cathode disposed within the chamber. In certain embodiment, the ion source comprises an RF antenna. In certain embodiment, a region surrounding the extraction aperture comprises the high density region. In some further embodiments, the remainder of the extraction plate comprises the low density region. In certain embodiments, the extraction plate further comprises a second high density region, and a high density channel connecting the high density region and the second high density region. In some embodiments, the second high density region is disposed near an edge of the extraction plate. In certain embodiments, the interior portion of the low density region comprises a lattice pattern. In certain embodiments, the interior portion of the low density region comprises voids created by varying at least one operating parameter used to create the extraction plate. In certain embodiments, the relative density of the low density region is at least 0.2 less than the relative density of the high density region, wherein relative density is defined as a volume of material used to create a portion of the extraction plate divided by a total volume of the portion.

According to another embodiment, an extraction plate is disclosed. The extraction plate comprises an extraction aperture, wherein the extraction plate comprises a low density region and a high density region. In certain embodiments, the region surrounding the extraction aperture comprises the high density region. In some embodiments, the remainder of the extraction plate comprises the low density region. In certain embodiments, the interior portion of the low density region comprises a lattice pattern. In certain embodiments, the interior portion of the low density region comprises voids created by varying at least one operating parameter used to create the extraction plate.

BRIEF DESCRIPTION OF THE FIGURES

For a better understanding of the present disclosure, reference is made to the accompanying drawings, which are incorporated herein by reference and in which.

DETAILED DESCRIPTION

As described above, varying the amount of material is one method of creating thermal gradients in a component. Traditional subtractive processes may remove material from certain regions to create thin regions. In certain embodiments, holes may be disposed throughout a region of a component to reduce the thermal conductivity of that region. However, as described above, thinning a component may affect its strength and durability.

Additive manufacturing techniques allows a component to be manufactured differently. Rather than removing material as is traditionally done, additive manufacturing techniques create the component in a layer by layer fashion. One such additive manufacturing technique is known as Direct Metal Laser Sintering (DMLS) uses a powder bed and a laser. A thin layer of powder is applied to a workpiece space. A laser is used to sinter the powder, only in the areas where the component to be formed. The remainder of the metal powder remains and forms a powder bed. After the laser process is completed, another thin layer of metal powder is applied on top of the existing powder bed. The laser is again used to sinter specific locations. This process may be repeated an arbitrary number of times.

While DMLS is one technique, there are many others. For example, metal binder jetting is similar to DMLS, except that rather than using a laser to sinter the powder, a liquid binder is applied to the areas from which the component is to be formed. Another example of additive manufacturing is electron beam printing. In this embodiment, a thin filament of metal is extruded from a nozzle and a laser or electron beam is used to melt the metal as it is extruded. In this embodiment, the metal is only applied to those areas that are to become part of the component. Of course, other types of additive manufacturing may also be employed.

Because of the layer by layer fashion used to construct the component, shapes and other aspects, which are not possible with traditional subtractive manufacturing techniques may be produced.

Figure 1A:
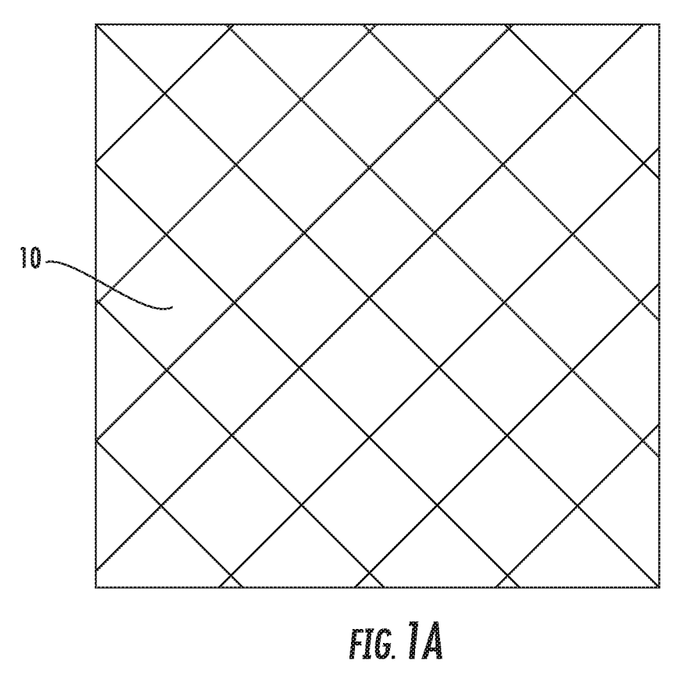
FIG. 1A-1D are cross-sectional views of low density regions of a component according to various embodiments.
Figure 1B:
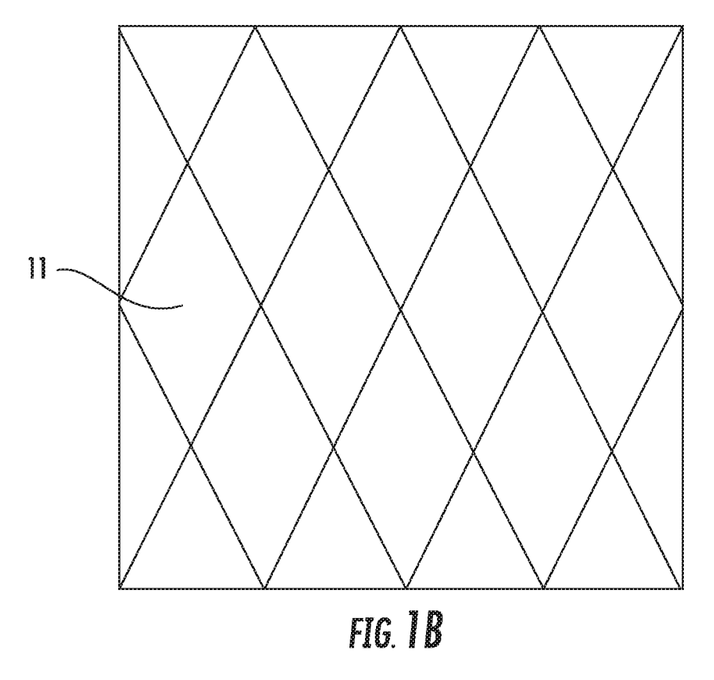
Figure 1C:
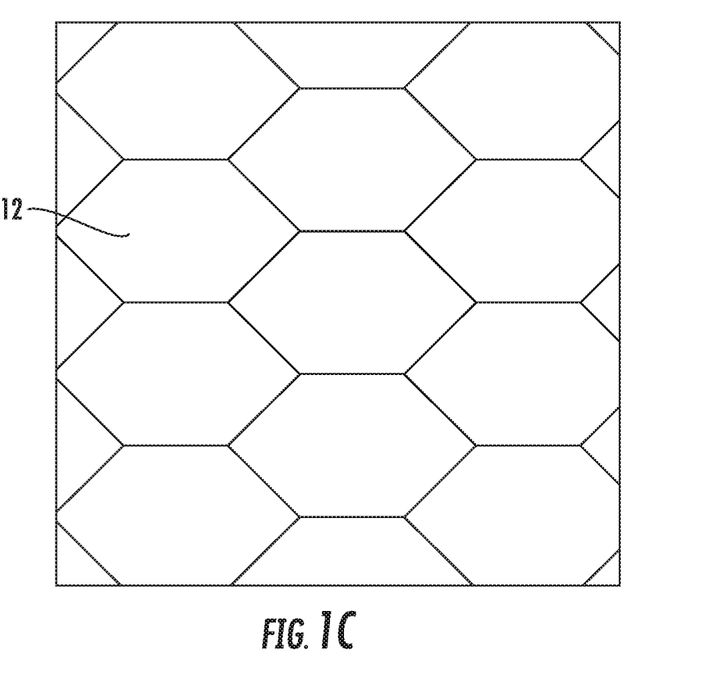
Figure 1D:
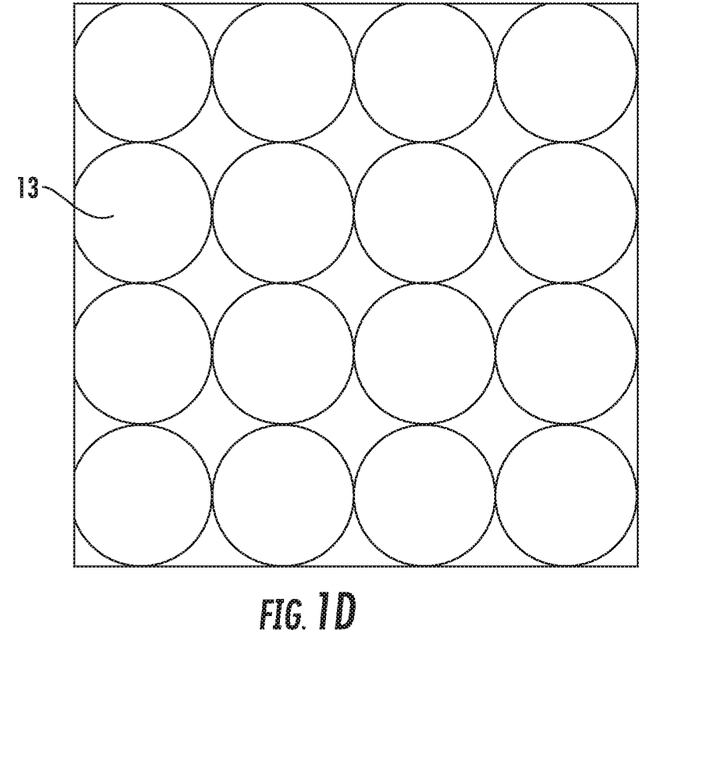

FIGS. 1A-1D shows various cross-sections of a component that comprises a non-solid interior. The patterns displayed in FIGS. 1A-1D may be referred to as lattices or lattice patterns. FIG.1A shows a lattice that comprises a plurality of adjacent squares 10. Each square 10 shares a wall with an adjacent square. Thus, in this lattice, each square is surrounded by four other squares. FIG. 1B shows a lattice comprising a plurality of adjacent diamonds 11. Like FIG. 1A, each diamond 11 shares a wall with an adjacent diamond. Thus, each diamond is surrounded by four other diamonds. FIG. 1C shows a lattice comprising a plurality of adjacent hexagons 12. Each hexagon 12 shares a wall with an adjacent hexagon. Thus, in this lattice, each hexagon is surrounded by six other hexagons. FIG. 1D shows a lattice comprising a plurality of adjacent circles 13. Of course, lattices may be formed with other shapes, such as octagons, pentagons, ovals, ellipses and irregular shapes. Further, the lattices may be formed using two or more different shapes. The selection of a lattice pattern may be based on the desired strength, weight and other factors. These lattice patterns may define an interior portion of the component. In each of these embodiments, the open spaces in the lattice are typically filled with a gas, such as air.

The concept of relative density is a fraction that represents the density of a component made with a certain material as compared to the theoretical density of that material. For example, for FIG. 1A, the volume of material that is used to form the walls of the lattice and outer surfaces may be divided by the total volume of the component to yield a relative density. Stated differently, relative density is a fraction that compares the volume of material used to make a portion of the component, divided by the actual volume of that portion of the component. The relative density may be varied by changing the volume of open space in the component. For example, if the squares 10 in FIG. 1A are made larger, with no change in the thickness in the walls of the squares 10, the relative density would be decreased. Conversely, increasing the thickness of the walls of the squares 10 or decreasing the size of the squares 10 without changing the thickness of the walls would increase the relative density.

Relative density correlates with thermal conductivity. Specifically, for components that comprise the same material, the component with the higher relative density will have greater thermal conductivity.

Another benefit of additive manufacturing is that different relative densities may be created within the same component. For example, a region of the component may be completely solid, which has a relative density of 1. Another region of the same component may be created with a lattice structure, such as one of those shown in FIGS. 1A-1D. This region will have a lower relative density and consequently, a lower thermal conductivity.

Additive manufacturing also provides a second manner in which the density may be affected. As described above, DMLS uses a laser to melt and sinter the material. The operating parameters used during the DMLS process impact the relative density. For example, the scanning velocity and power used for the laser affect the relative density of the component. Table 1 shows the effects of scanning velocity and laser power on relative density according to one test. Scanning velocities are listed along the horizontal heading, while laser power is shown in the vertical heading. In this test, the same material was used throughout, where the only changes in the test were the changes in operating parameters illustrated in the table.

TABLE 1

|       | 1300 mm/sec | 1700 mm/sec | 2100 mm/sec |
|-------|-------------|-------------|-------------|
| 500 W | .998        | .985        | .953        |
| 700 W | .998        | .989        | .984        |
| 900 W | .998        | .996        | .995        |

This table shows that the relative density can be lowered by lowering the laser power and/or increasing the scanning velocity. These changes in at least one operating parameter cause voids to be created within the component. These voids lower the relative density of the component, or a certain portion of the component. This method may be combined with the use of lattices, as shown in FIGS. 1A-1D, or may be used independently.

These two techniques allow for the formation of a component having non-uniform density. This allows the flow of heat to be controlled in that component.

Figure 2A:
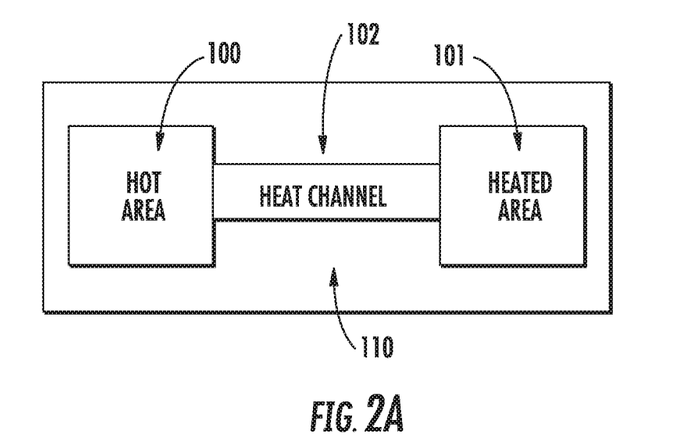
FIGS. 2A-2B show a component designed using high density regions and low density regions according to one embodiment.

FIG. 2A shows a component that has high density regions and low density regions. The terms "high density region" and "low density region" are relative terms. A high density region has a relative density that is greater than the relative density of the low density region. In certain embodiments, a high density region may be any region having a relative density that is 0.75 or greater. In certain embodiments, a high density region may be any region having a relative density that is 0.85 or greater. In certain embodiments, a high density region may be any region having a relative density of 0.90 or greater, although other thresholds may be used.

Low density regions are those regions that have a relative density that is less than the high density region. In certain embodiments, a low density region may have a relative density of 0.60 or less, although other thresholds may be used. In certain embodiments, the relationship between the relative densities of two regions may be used to define the two different areas. For example, in some embodiments, the relative density of a low density region may be at least 0.2 less than the relative density of a high density region. In other words, if the high density region on the component has a relative density of 0.9, any region having a relative density less than 0.7 would be considered a low density region. In other embodiments, the relative density of a low density region may be at least 0.1 less than the relative density of a high density region.

In FIG. 2A, there is a first high density region 100, a second high density region 101 and a high density channel 102 connecting the first high density region 100 to the second high density region 101. All other regions of the component are low density regions 110. In this example, first high density region 100 may be a region that is being directly heated. This may be by interaction with an ion beam, a resistive heater, a heat lamp, or some other mechanism. The thermal energy in the first high density region 100 preferably travels along the high density channel 102 to the second high density region 101. In other words, the thermal energy is not equally distributed along the component. Rather, the thermal energy is mostly concentrated in the high density regions of the component.

Figure 2B:
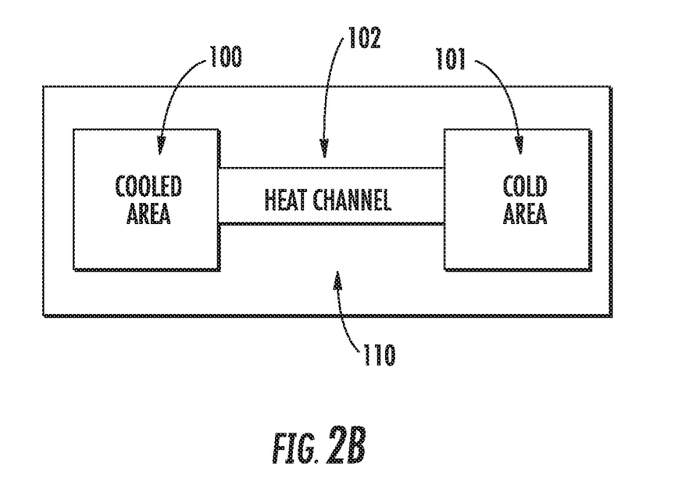

While FIG. 2A shows the first high density region 100 as being a heated region, other embodiments are also possible. For example, the first high density region 100 may be a cooled region, as shown in FIG. 2B. In this embodiment, thermal energy travels from the second high density region 101 toward the first high density region 100 via high density channel 102. Thus, in this embodiment, the high density regions and the high density channel will be at a lower temperature than the rest of the component.

While FIGS. 2A-2B show a single high density channel 102, the disclosure is not limited. For example, more high density channels may be included. Further, additional high density regions can also be included, such that the thermal energy is distributed to the high density regions via respective high density channels.

The use of high density channels is beneficial when it is advantageous to distribute the thermal energy to other regions on the component.

Figure 3A:
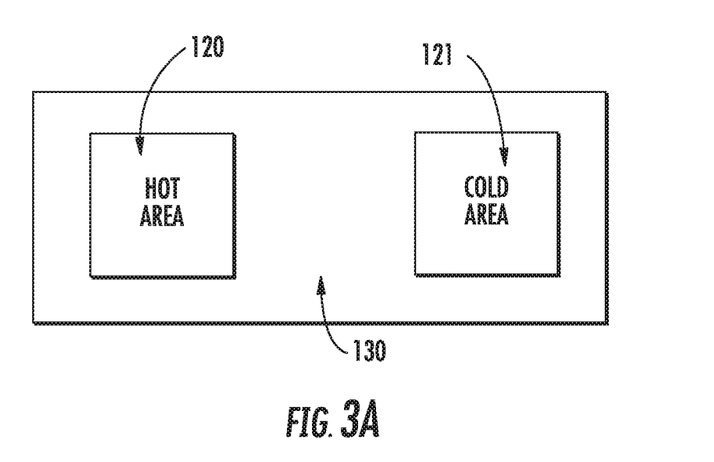
FIGS. 3A-3B shows a component designed using high density regions and low density regions according to another embodiment.

However, it is also possible to create thermally distinct regions. For example, FIG. 3A shows a first high density region 120 and a second high density region 121. Unlike the embodiment of FIGS. 2A-2B, these two high density regions are not connected by a high density channel. Rather, these two high density regions are thermally isolated from one another. Because the thermal conductivity through the low density region 130 is poor, most of the thermal energy in the first high density region 120 will tend to be contained in that region. Similarly, if the second high density region 121 is a cooled region, it will extract less thermal energy from the surrounding low density regions. In other words, thermal isolation may be achieved through the use of low density regions surrounding high density regions.

In this way, thermal energy may be more contained in high density regions and restricted from flowing to the low density regions. While FIG. 3A shows two high density regions, it is understood that a single high density region may be utilized. In this embodiment, that high density region will be hotter, or colder, than the surrounding low density regions.

Figure 3B:
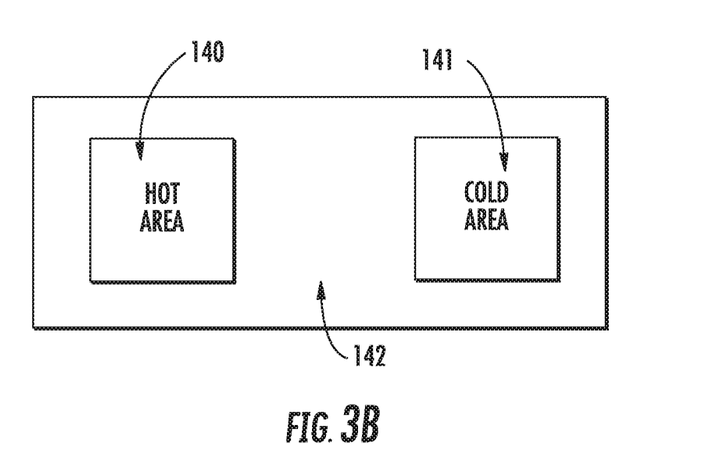

In another embodiment, thermally isolated regions can be created from low density regions. FIG. 3B shows a first low density region 140 and a second low density region 141. The regions around these low density regions may be a high density region 142. A high density region 142 may be used to retain the strength of the component. These two low density regions are thermally isolated from one another. Because the thermal conductivity through the first low density region 140 is poor, most of the thermal energy in the first low density region 140 will tend to be contained in that region. Similarly, if the second low density region 141 is a cooled region, it will extract less thermal energy from the surrounding high density region 142. In other words, thermal isolation may be achieved through the use of low density regions surrounded by a high density region 142.

Further, the patterns shown in FIGS. 2A-2B and FIGS. 3A-3B may be combined. In other words, one component may have thermally isolated high density regions, as well as other high density regions that are connected by one or more high density channels. Additionally or alternatively, the component may have thermally isolated low density regions, as well as high density regions that are connected by one or more high density channels.

Through the use of additive manufacturing, and more specifically lattices and variation in operating parameters, a component can be produced having at least one high density region and at least one low density region. Through proper placement of these high density regions and low density regions, the component may be manufactured so as to have a predetermined thermal gradient and a desired flow of thermal energy.

Having described the process to create high and low density regions, and illustrated the thermal benefits of proper placement of these regions, specific components within the workpiece processing system may be fabricated accordingly.

Figure 4A:
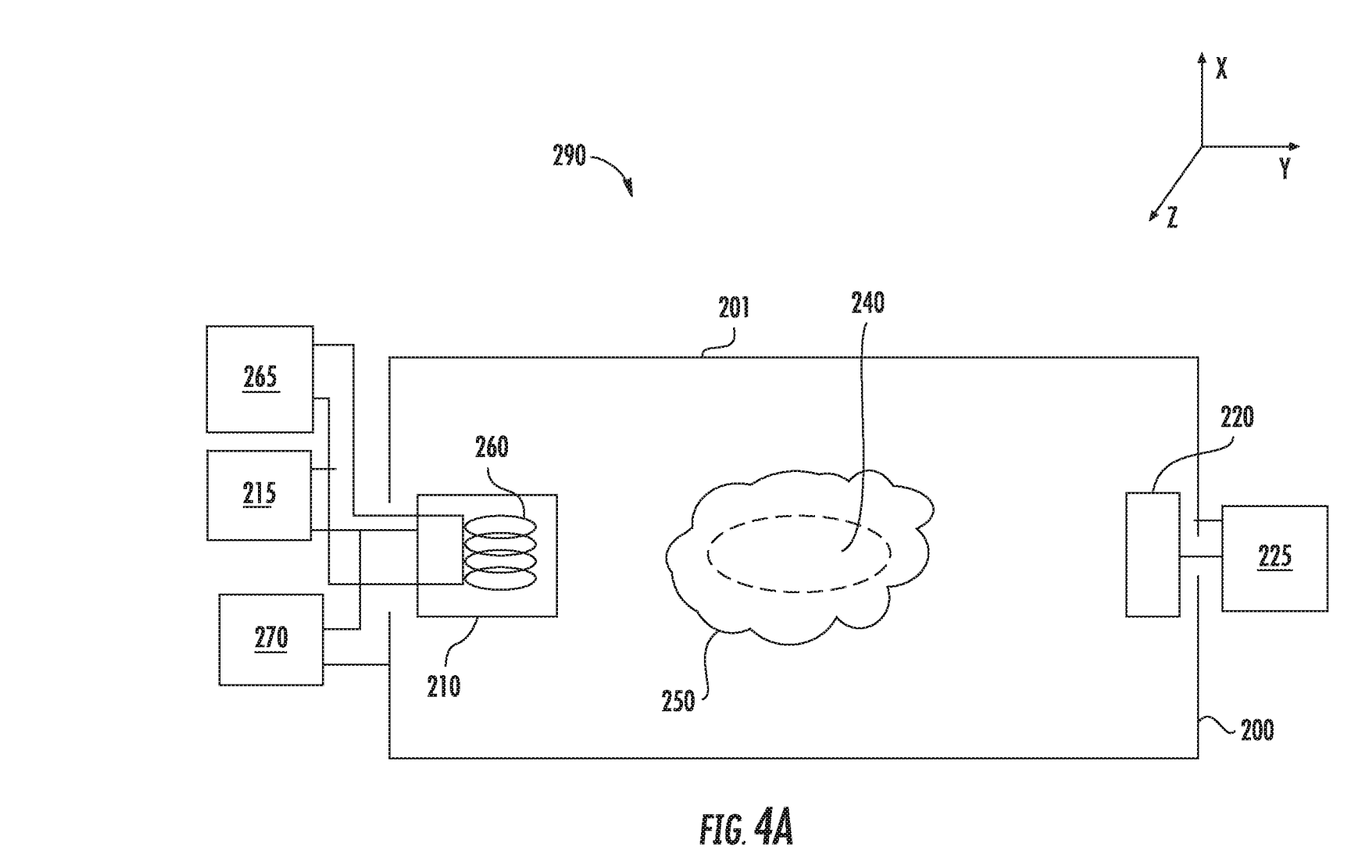
FIG. 4A shows an indirectly heated cathode ion source that may utilize the extraction plate described herein.
Figure 4B:
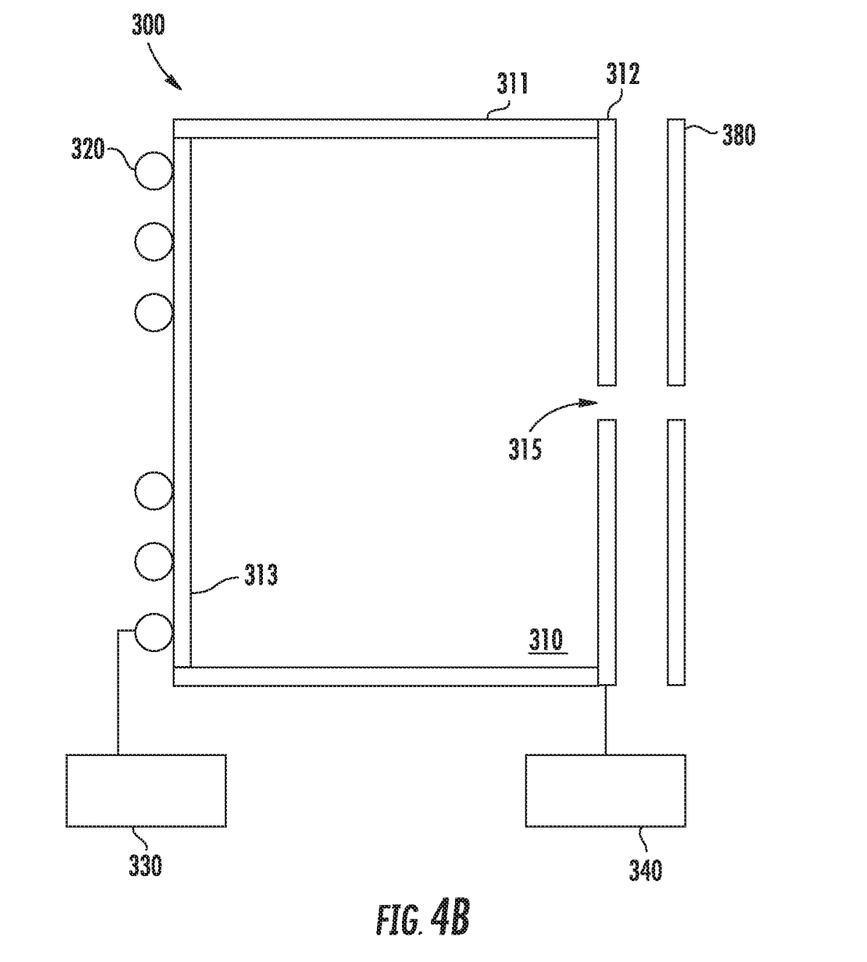
FIG. 4B shows a plasma chamber that may utilize the extraction plate described herein.

FIG. 4A shows a traditional ion source using an indirectly heated cathode. FIG. 4B shows a traditional plasma chamber.

FIG. 4A is a cross-sectional view of the IHC ion source 290. The IHC ion source 290 includes a chamber 200, comprising two opposite ends, and side walls 201 connecting to these ends. The chamber 200 also includes a bottom wall and an extraction plate. The walls of the chamber 200 may be constructed of an electrically conductive material and may be in electrical communication with one another. A cathode 210 is disposed in the chamber 200 at a first end of the chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 is electrical biased relative to the chamber 200, using cathode power supply 270.

In this embodiment, a repeller 220 is disposed in the chamber 200 on the second end of the chamber 200 opposite the cathode 210. The repeller 220 may be in communication with repeller power supply 225. As the name suggests, the repeller 220 serves to repel the electrons emitted from the cathode 210 back toward the center of the chamber 200. For example, the repeller 220 may be biased at a negative voltage relative to the chamber 200 to repel the electrons. For example, the repeller power supply 225 may have an output in the range of 0 to −150V, although other voltages may be used. In certain embodiments, the repeller 220 is biased at between 0 and −150V relative to the chamber 200. In other embodiments, the repeller 220 may be grounded or floated.

In operation, a gas is supplied to the chamber 200. The thermionic electrons emitted from the cathode 210 cause the gas to form a plasma 250. Ions from this plasma 250 are then extracted through an extraction aperture 240 in the extraction plate. The ions are then manipulated to form an ion beam that is directed toward the workpiece.

FIG. 4B shows a plasma chamber that includes an ion source 300. The RF ion source 300 comprises a plurality of chamber walls 311 defining an ion source chamber 310. An RF antenna 320 may be disposed against a dielectric window 313. This dielectric window 313 may comprise part or all of one of the chamber walls 311. The RF antenna 320 may comprise an electrically conductive material, such as copper. An RF power supply 330 is in electrical communication with the RF antenna 320. The RF power supply 330 may supply an RF voltage to the RF antenna 320. The power supplied by the RF power supply 330 may be between 0.1 and 10 kW and may be any suitable frequency, such as between 1 and 15 MHz. Further, the power supplied by the RF power supply 330 may be pulsed.

In certain embodiments, the chamber walls 311 may be electrically conductive, and may be constructed of metal. In certain embodiments, these chamber walls 311 may be electrically biased by bias power supply 340. The bias voltage applied to the chamber walls 311 establishes the potential of the plasma within the ion source chamber 310. The difference between the electrical potential of the plasma and the electrical potential of the ground electrode 380 may help determine the energy that the extracted ions possess.

One chamber wall, referred to as the extraction plate 312, includes an extraction aperture 315. The extraction aperture 315 may be an opening through which the ions generated in the ion source chamber 310 are extracted and directed toward a workpiece. The extraction aperture 315 may be any suitable shape. In certain embodiments, the extraction aperture 315 may be oval or rectangular shaped, having one dimension, referred to as the length, which may be much larger than the second dimension, referred to as the height. As described above, in certain embodiments, all of the chamber walls 311 and the extraction plate 312 are electrically conductive. In other embodiments, only the extraction plate 312 is electrically conductive and in communication with the bias power supply 340. The remaining chamber walls 311 may be made of a dielectric material. The bias power supply 340 may bias the chamber walls 311 and the extraction plate 312 at a RF voltage of between 0.5 kV and 10 kV, and a frequency of between 0.1 and 50 MHz.

In operation, the RF antenna 320 is energized and causes feed gas in the ion source chamber 310 to form a plasma. The difference in potential between the extraction plate 312 and the ground electrode 380 causes ions to exit through the extraction aperture 315.

Figure 5:
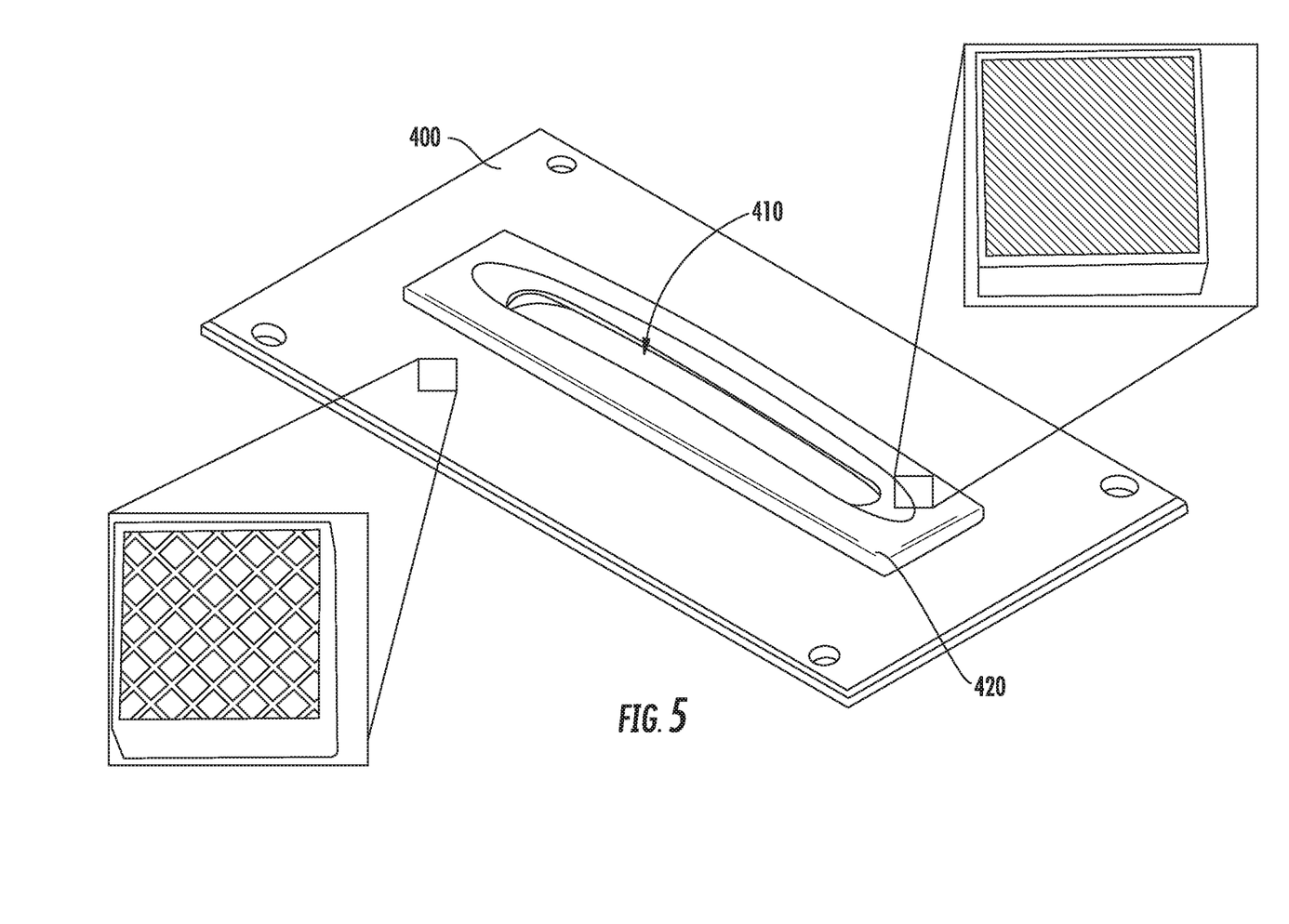
FIG. 5 shows an extraction plate with an extraction aperture that utilizes high density and low density regions.

A view of an extraction plate 400 is shown in FIG. 5. This extraction plate 400 may be used in the IHC ion source 290 of FIG. 4A or the ion source 300 shown in FIG. 4B. In both embodiments, the extraction plate 400 comprises an extraction aperture 410 through which ions pass. The extraction plate 400 is typically physically connected to the sidewalls and ends of the chamber, as shown in FIGS. 4A and 4B.

In certain embodiments, it may be beneficial for the region around the extraction aperture 410 to remain at an elevated temperature. For example, deposition along the extraction aperture 410 may be minimized by changing the temperature of the region around the extraction aperture 410 based on the species of gas being used to generate the ions. In certain embodiments, it may be beneficial to maintain the temperature of the region around the extraction aperture 410 at a very elevated temperature. In other embodiments, it may be beneficial to remove as much thermal energy as possible from the region around the extraction aperture 410.

In FIG. 5, an area that surrounds the extraction aperture 410 is a high density region 420. The remainder of the extraction plate 400 is a low density region. As described above, a low density region may be created using a lattice pattern, as shown in FIGS. 1A-1D and/or varying the operating parameters, as shown in Table 1. In this way, the thermal energy generated at or near the extraction aperture 410 tends to remain contained in the high density region 420. This maintains the high density region 420 at an elevated temperature. This may minimize the possibility of deposition around the area that surrounds the extraction aperture.

Of course, other embodiments are also possible. For example, it may beneficial in some embodiments to transfer the thermal energy away from the area that surrounds the extraction aperture. This may be accomplished by using high density channels, as shown in FIGS. 2A-2B to route the thermal energy to another region of the extraction plate 400, such as a region near one edge which is in contact with a heat sink. Further, multiple high density channels may be created if it is advantageous to transfer the thermal energy from the high density region 420 to a plurality of other high density regions. For example, in one embodiment, one or more high density regions may be created near edges of the extraction plate, where the extraction plate is attached, adhered or otherwise fastened to a wall of the chamber. One or more high density channels may be used to thermally connect the region surrounding the extraction aperture to these other high density regions.

While FIG. 5 shows the use of additive manufacturing to create an extraction plate having at least one high density region and one low density regions, the disclosure is not limited to this embodiment.

Figure 6:
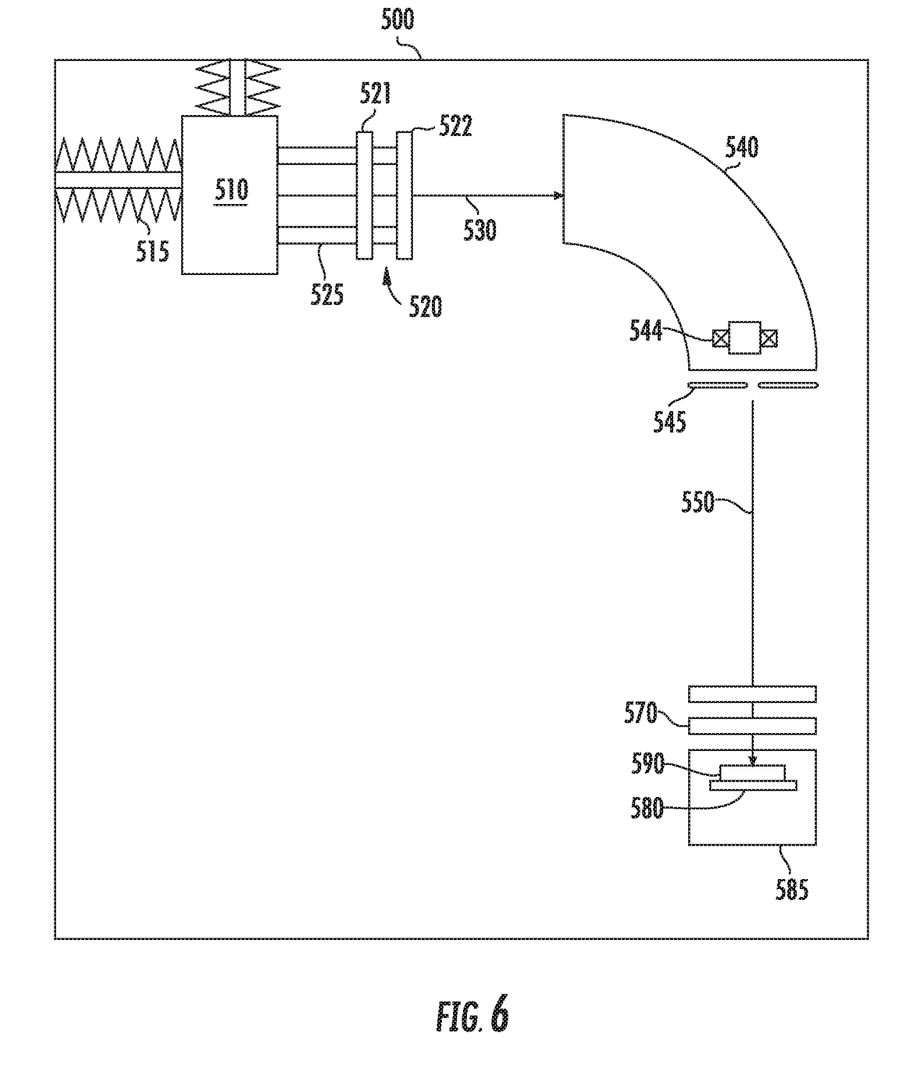
FIG. 6 shows an ion implantation system that utilizes a component having high density and low density regions.

FIG. 6 shows a beam line ion implantation system. In one embodiment, the ion source 510 may include an indirectly heated cathode (IHC), housed within a tungsten chamber. This ion source 510 may be contained within a larger housing 500. As the ion source 510 is typically biased at a substantial voltage, it may be necessary to electrically isolate the ion source 510 from the housing 500. This may be achieved through the use of source bushings 515.

Outside the ion source 510 are one or more electrodes 520, which are appropriately biased to attract ions generated in the ion source 510. The electrodes 520 draw these ions to, and then through the electrode 520. In some embodiments, there may be multiple electrodes 520, such as an extraction electrode 521 and a suppression electrode 522. These electrodes 520 may be at different voltages, and therefore are electrically isolated from one another. These may be achieved through the use of an insulated manipulator assembly 525, which holds the electrodes 520 in place.

The extracted ion beam 530 may then enter a mass analyzer 540. The ion beam flows through a guide tube (not shown) in the mass analyzer. In some embodiments, a focusing element, such as a quadrupole lens 544 or Einsel lens, may be used to focus the ion beam. A resolving aperture 545 is disposed at the output of the mass analyzer 540, which extracts only ions having the desired charge/mass ratio. The analyzed ion beam 550, which now contains only the ions of interest, is then implanted into the substrate 590, which may be mounted on a substrate support 580. In some embodiments, one or more acceleration or deceleration stages 570 may be employed to adjust the speed of the analyzed ion beam 550. These acceleration or deceleration stages 570 may be disposed proximate a process chamber 585. The substrate 590 and substrate support 580 may be disposed in the process chamber 585.

Any of the components described as part of the ion implantation system may be fabricated as described above to include at least one low density region and one high density region.

Further, while the above disclosure describes various additive manufacturing processes that may be associated with metal, the techniques and components described herein may be fabricated from a non-metal material. For example, plastic or ceramic parts may be created using the techniques described herein.

The system, component and methods of fabricating the component described herein have many advantages. As noted above, in certain embodiments, it is beneficial that a component have particular thermal gradient characteristics. By varying the density of different regions of the component, the path of thermal transfer can be more tightly controlled. For example, localized hot (or cold) regions can be created. Alternatively, thermal energy can be routed along a specific path between two or more regions of the component. The components described herein have additional benefits. Using subtractive manufacturing, the only way to control thermal gradient is to remove material, either by creating a hole or by thinning the component. Both of these actions reduce the strength of the component, decrease its durability and increase its brittleness. These pitfalls can be avoided using additive manufacturing techniques as described herein. The low density regions and high density regions of the components manufactured using additive manufacturing may be the same thickness, decreasing its brittleness while maintaining strength.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising at least one component that includes a high density region and a low density region configured to control a thermal gradient and flow of thermal energy, wherein the high density region has a higher relative density than the low density region, wherein relative density is defined as a volume of material used to create a portion of the at least one component, divided by a total volume of the portion.

2. The ion implantation system of claim 1, wherein the at least one component is an extraction plate.

3. The ion implantation system of claim 1, wherein an interior portion of the low density region comprises a lattice pattern.

4. The ion implantation system of claim 1, wherein an interior portion of the low density region comprises voids created by varying at least one operating parameter used to create the at least one component.

5. An apparatus, comprising:
a plurality of walls defining a chamber, wherein one wall of the plurality of walls is an extraction plate having an extraction aperture; and
an ion source to create ions within the chamber;
wherein the extraction plate comprises a low density region and a high density region.

6. The apparatus of claim 5, wherein the ion source comprises an indirectly heated cathode disposed within the chamber.

7. The apparatus of claim 5, wherein the ion source comprises an RF antenna.

8. The apparatus of claim 5, wherein a region surrounding the extraction aperture comprises the high density region.

9. The apparatus of claim 8, wherein a remainder of the extraction plate comprises the low density region.

10. The apparatus of claim 8, wherein the extraction plate further comprises a second high density region, and a high density channel connecting the high density region and the second high density region.

11. The apparatus of claim 10, wherein the second high density region is disposed near an edge of the extraction plate.

12. The apparatus of claim 10, wherein the second high density region is an area where the extraction plate is fastened to a wall of the chamber.

13. The apparatus of claim 5, wherein an interior portion of the low density region comprises a lattice pattern.

14. The apparatus of claim 5, wherein an interior portion of the low density region comprises voids created by varying at least one operating parameter used to create the extraction plate.

15. The apparatus of claim 5, wherein a relative density of the low density region is at least 0.2 less than a relative density of the high density region, wherein relative density is defined as a volume of material used to create a portion of the extraction plate divided by a total volume of the portion.

16. An extraction plate, comprising: an extraction aperture, wherein the extraction plate comprises a low density region and a high density region, wherein the high density region has a higher relative density than the low density region, wherein relative density is defined as a volume of material used to create a portion of the at least one component, divided by a total volume of the portion.

17. The extraction plate of claim 16, wherein a region surrounding the extraction aperture comprises the high density region.

18. The extraction plate of claim 17, wherein a remainder of the extraction plate comprises the low density region.

19. The extraction plate of claim 16, wherein an interior portion of the low density region comprises a lattice pattern.

20. The extraction plate of claim 16, wherein an interior portion of the low density region comprises voids created by varying at least one operating parameter used to create the extraction plate.

\* \* \* \* \*